(12) United States Patent
Shakuda et al.

(10) Patent No.: US 8,030,669 B2
(45) Date of Patent: Oct. 4, 2011

(54) SEMICONDUCTOR LIGHT EMITTING DEVICE

(75) Inventors: Yukio Shakuda, Kyoto (JP); Toshio Nishida, Kyoto (JP); Masayuki Sonobe, Kyoto (JP)

(73) Assignee: Rohm Co., Ltd., Kyoto (JP)

( * ) Notice: Subject to any disclaimer, the term of this patent is extended or adjusted under 35 U.S.C. 154(b) by 1014 days.

(21) Appl. No.: 11/662,541

(22) PCT Filed: Sep. 12, 2005

(86) PCT No.: PCT/JP2005/016751
§ 371 (c)(1),
(2), (4) Date: Mar. 12, 2007

(87) PCT Pub. No.: WO2006/030733
PCT Pub. Date: Mar. 23, 2006

(65) Prior Publication Data
US 2007/0257268 A1 Nov. 8, 2007

(30) Foreign Application Priority Data
Sep. 13, 2004 (JP) .................................. 2004-265463

(51) Int. Cl.
*H01L 33/00* (2010.01)
(52) U.S. Cl. ......... 257/88; 257/82; 257/93; 257/E27.12; 257/E27.121; 257/E33.027
(58) Field of Classification Search ............ 257/88, 257/E27.12, 82, 93, E27.121, E33.027; 361/181, 361/70; 336/70; 541/88, E27.12
See application file for complete search history.

(56) References Cited

U.S. PATENT DOCUMENTS

| | | | | |
|---|---|---|---|---|
| 2,341,932 A | * | 2/1944 | MacCarthy | 361/70 |
| 3,038,103 A | * | 6/1962 | Grecu | 315/241 R |
| 4,773,075 A | * | 9/1988 | Akiba et al. | 372/50.11 |
| 5,012,157 A | * | 4/1991 | Walton et al. | 315/66 |
| 5,187,377 A | * | 2/1993 | Katoh | 257/89 |
| 5,578,907 A | * | 11/1996 | Tao et al. | 315/247 |
| 5,683,937 A | | 11/1997 | Furukawa et al. | |

(Continued)

FOREIGN PATENT DOCUMENTS
JP    06-029091    2/1994
(Continued)

OTHER PUBLICATIONS
English Translation of Front page of JP 2000-101136.*

Primary Examiner — Hrayr A Sayadian
(74) Attorney, Agent, or Firm — Rabin & Berdo, PC

(57) ABSTRACT

There is provided a highly reliable semiconductor light emitting device even in using for street lamps or traffic signals, which can be used in place of electric lamps or fluorescent lamps by protecting from surges such as static electricity or the like. A plurality of light emitting units (1) are formed, by forming a semiconductor lamination portion by laminating semiconductor layers on a substrate so as to form a light emitting layer, by electrically separating the semiconductor lamination portion into a plurality, and by providing a pair of electrodes (19) and (20). The light emitting units (1) are respectively connected in series and/or in parallel with wiring films (3). An inductor (8) absorbing surges is connected, in series, to the plurality of light emitting units (1) connected in series between electrode pads (4*a*) and (4*b*) connected to an external power source. For an example, the inductor (8) is formed by arranging the plurality of light emitting units (1) in a whirl shape.

4 Claims, 5 Drawing Sheets

U.S. PATENT DOCUMENTS

| | | | |
|---|---|---|---|
| 5,936,599 A * | 8/1999 | Reymond | 345/82 |
| 6,259,715 B1 * | 7/2001 | Nakayama | 372/50.1 |
| 6,472,718 B2 * | 10/2002 | Lell | 257/446 |
| 6,480,110 B2 * | 11/2002 | Lee et al. | 340/572.5 |
| 6,547,249 B2 | 4/2003 | Collins, III et al. | |
| 6,714,113 B1 * | 3/2004 | Abadeer et al. | 336/223 |
| 7,285,801 B2 * | 10/2007 | Eliashevich et al. | 257/96 |
| 7,439,549 B2 * | 10/2008 | Marchl et al. | 257/88 |
| 7,592,633 B2 * | 9/2009 | Shakuda | 257/88 |
| 7,723,737 B2 * | 5/2010 | Lee et al. | 257/88 |
| 2002/0096994 A1 * | 7/2002 | Iwafuchi et al. | 313/495 |
| 2004/0026706 A1 * | 2/2004 | Bogner et al. | 257/99 |
| 2004/0115849 A1 * | 6/2004 | Iwafuchi et al. | 438/25 |
| 2005/0030084 A1 * | 2/2005 | Watanabe et al. | 327/423 |
| 2006/0023451 A1 * | 2/2006 | Han et al. | 362/249 |
| 2006/0169993 A1 * | 8/2006 | Fan et al. | 257/88 |
| 2008/0230765 A1 * | 9/2008 | Yoon et al. | 257/13 |
| 2008/0246040 A1 * | 10/2008 | Sakai et al. | 257/76 |

FOREIGN PATENT DOCUMENTS

| | | |
|---|---|---|
| JP | 10-083701 | 3/1998 |
| JP | 2000101136 A * | 4/2000 |
| JP | 2001-008386 | 1/2001 |
| WO | WO-02/089222 | 11/2002 |
| WO | WO-2004/023568 | 3/2004 |

* cited by examiner

SEMICONDUCTOR LIGHT EMITTING DEVICE

FIELD OF THE INVENTION

The present invention relates to a semiconductor light emitting device in which a plurality of light emitting units are formed on a substrate and connected in series and/or parallel, and which can be used for light sources in place of incandescent lamps or fluorescent lamps used with commercial alternative current power sources of a voltage of, for example, 100 V. More particularly, the present invention relates to a semiconductor light emitting device which has a strong structure against surges or the like in case that a plurality of light emitting units made of semiconductor are connected in series and that connection terminals thereof are connected to a commercial alternative current power source of 100 V or the like.

BACKGROUND OF THE INVENTION

Being accompanied with developing blue light emitting diodes (LEDs), the LEDs are recently used for light sources of displays or traffic signals and furthermore become to be used in place of incandescent lamps or fluorescent lamps. As it is preferable that the LEDs can be operated simply with AC driving of 100 V or the like in case that the LEDs are used in place of the incandescent lamps or the fluorescent lamps, as shown, for example, in FIG. 8, a structure in which the LEDs connected in series and/or parallel are connected to an alternative current power source 71 is known well. Here, S represents a switch (cf. for example PATENT DOCUMENT 1).
PATENT DOCUMENT 1: Japanese Patent Application Laid-Open No. HEI10-083701 (FIG. 3)

DISCLOSURE OF THE INVENTION

Problem to be Solved by the Present Invention

As described above, electric power consumption can be reduced by using a plurality of LEDs connected in series and/or parallel in place of incandescent lamps or the like. However, since LEDs are originally formed by laminating semiconductor layers, a p-n junction of the semiconductor layers is broken if a high voltage like a surge is applied, and a problem of failures caused by a short circuit, an open circuit or the like is apt to arise. If a failure of a short circuit occurs, voltage applied to other LEDs connected in series rises and a life time of the other LEDs is shortened. On the other hand, if a failure of an open circuit occurs in one of LEDs connected in series, all LEDs connected in series can not emit light. Especially, in case of using LEDs for street lamps, traffic signals or the like, there exists a problem that LEDs are apt to suffer from influence of static electricity, for example in a low temperature or the like, or similarly from influence of lightning.

The present invention is directed to solve the above-described problems and an object of the present invention is to provide a highly reliable semiconductor light emitting device even in using for street lamps or traffic signals, which can be used in place of incandescent lamps or fluorescent lamps by protecting from surges such as static electricity or the like.

Means for Solving the Problem

A semiconductor light emitting device according to the present invention includes: a substrate; a semiconductor lamination portion formed on the substrate by laminating semiconductor layers so as to form a light emitting layer; a plurality of light emitting units formed by separating the semiconductor lamination portion electrically into a plurality of units, each of the plurality of light emitting units having a pair of electrodes which are connected to a pair of conductivity type layers of the semiconductor lamination portion, respectively; wiring films which are connected to the electrodes for connecting each of the plurality of light emitting units in series and/or parallel, and an inductor absorbing surges is connected in series to the plurality of light emitting units connected in series between a pair of electrode pads, which are connected to an external electric power source.

The inductor may be formed by arranging the plurality of light emitting units connected in series in a whirl shape, or may be formed between at least two light emitting units of the plurality of light emitting units connected in series or between one light emitting unit and one electrode pad with the wiring film.

Concretely, at least two groops of the plurality of light emitting units connected in series may be connected in parallel and in reverse polarity, or the plurality of light emitting units connected in series may be formed by connecting a plurality of sets in series, each of the sets being formed by connecting two light emitting units in parallel and in reverse polarity.

An electrical separation to form the plurality of light emitting units is formed by a separation groove formed in the semiconductor lamination portion and an insulating film deposited in the separation groove, wherein a dummy region which does not contribute to light emitting is formed between the separation groove and the light emitting unit of one side of the separation groove, and wherein the inductor may be formed on the dummy region.

In addition, a lot of light emitting units can be protected from surges with a small number of inductors by a structure in which at least two groups, each of which is formed by connecting a plurality of light emitting units in series, are connected in parallel between the pair of electrode pads, wherein the inductor is connected between a connection portion of the at least two groups and one of the pair of electrode pads.

Here, connecting in parallel includes a case of connecting in parallel and in reverse direction besides a case of connecting a plurality of light emitting units in parallel and in a forward direction.

Here, in case that the at least two groups of light emitting units are connected in parallel and in reverse polarity, it is preferable that the inductor is connected at each side of the pair of electrode pads.

It is preferable that the semiconductor lamination portion is made of nitride semiconductor, and that a light color conversion member converting a wavelength of light emitted in the light emitting layer to white light is provided at least at a light emitting surface side (a surface side radiating light emitted in the light emitting layer) of the semiconductor lamination portion, thereby to emit white light, because lighting devices can be obtained directly.

EFFECT OF THE INVENTION

By the present invention, in a semiconductor light emitting device formed by connecting light emitting units formed by laminating semiconductor layers in series and/or parallel, since an inductor absorbing surges is formed between a pair of electrode pads connected to an external electric power source so as to be in series to the light emitting units in the semiconductor light emitting device integrally, the light emitting unit can be protected without external connection of a safety device even if surges enter. Furthermore, if the light emitting units are arranged in a whirl shape, the inductor can be formed only by making a pattern of a whirl shape in separating each of light emitting units electrically from the semiconductor lamination portion and by wiring. Then, the inductor can be formed without adding spaces or increasing of production processes for forming an inductor. In this structure, by entrance of surges, electric current begins to flow through the light emitting units connected in series, however when the electric current flows in a whirl path, a magnetic field generated by the electric current inhibits the electric current from flowing. Although it is necessary to pattern at a time of forming wirings and to take out a wiring from a center of the whirl through the insulating film, for forming a wiring having a whirl shape between two light emitting units, the inductor can be formed by utilizing a space between the light emitting units and a process for wiring.

EXPLANATION OF LTTERS AND NUMERALS

Figure 1:
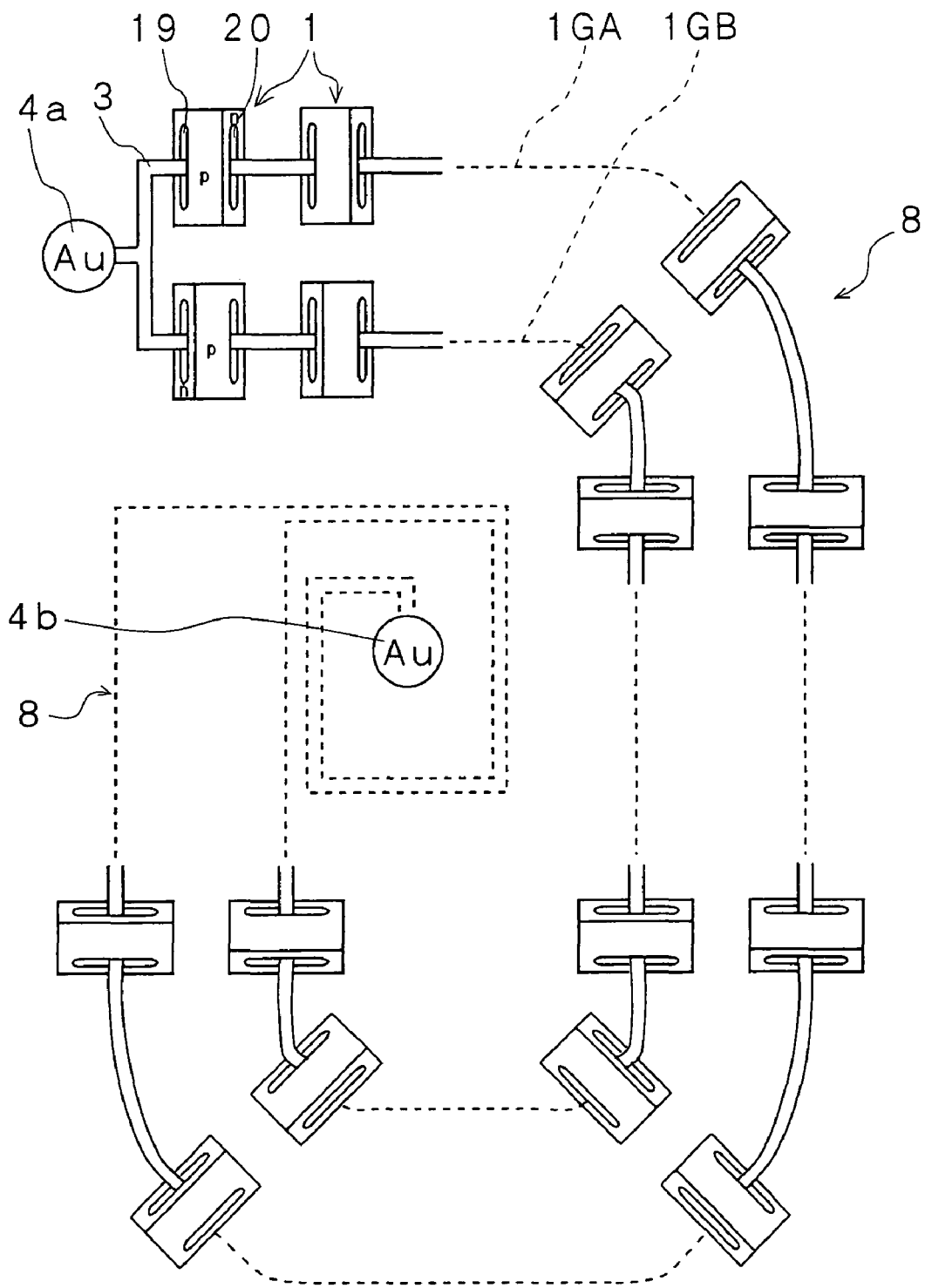
FIG. 1 is a schematic plan view explaining one embodiment of a semiconductor light emitting device according to the present invention.

1: light emitting unit
3: wiring film
4a and 4b: electrode pad
8: inductor
11: substrate
13: high temperature buffer layer
14: n-type layer
15: active layer
16: p-type layer
17: semiconductor lamination portion
17a: separation groove
18: light transmitting conductive layer
19: p-side electrode (upper electrode)
20: n-side electrode (lower electrode)
21: insulating film

THE BEST EMBODIMENT OF THE PRESENT INVENTION

Figure 3:
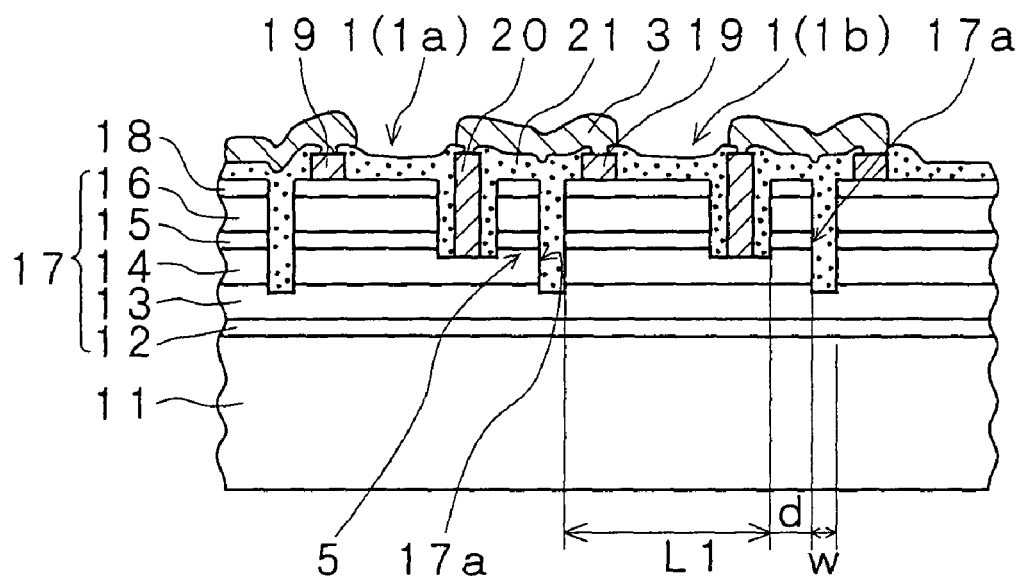
FIG. 3 is a cross-sectional view explaining an example of a light emitting unit of the light emitting device according to the present invention.

An explanation will be given below of a semiconductor light emitting device according to the present invention in reference to the drawings. As a schematic plan view explaining one embodiment is shown in FIG. 1 and as an example of a structure of a semiconductor lamination portion is shown in FIG. 3, in the semiconductor light emitting device according to the present invention, a semiconductor lamination portion 17 is formed on the substrate 11 by laminating semiconductor layers so as to form a light emitting layer, and a plurality of light emitting units 1 are formed by separating the semiconductor lamination portion 17 electrically into a plurality of units, each of which has a pair of electrodes 19 and 20. Each of the plurality of light emitting units 1 is connected to each other in series and/or parallel through wiring films 3, and an inductor 8 absorbing surges is formed in series to the plurality of light emitting units 1 connected in series between a pair of electrode pads 4a and 4b which are connected to an external electric power source. In the example shown in FIG. 1, the inductor is formed by arranging the plurality of light emitting units 1 in a whirl shape.

In other words, in the example shown in FIG. 1, a first group 1GA of light emitting units, in which each of the light emitting units 1 are connected in series by arranging directions of a "pn" (order of a p-side electrode 19 and an n-side electrode 20) in a same direction and a second group 1GB of light emitting units, in which each of the light emitting units 1 are connected in series by arranging directions of a "pn" in a reverse (inverse) direction are connected in reverse parallel between the pair of electrode pads 4a and 4b, and each of the groups 1GA and 1GB is arranged in a whirl shape. In case of using in place of incandescent lamps operating directly connected to 100 V of a commercial electric power source, the light emitting units 1 are connected so that a voltage 100 V is applied between the pair of electrode pads 4a and 4b to be connected to the alternative current power source. Namely, since an operation voltage per one light emitting unit is 3.5 to 5 V, approximately 20 to 30 light emitting units 1 are connected in series and in the whirl shape with the wiring film 3. When a total voltage of the operation voltage of the plurality light emitting units 1 is not a voltage of a commercial electric power source of just 100 V or the like, an adjustment by connecting a resistor or a capacitor in series may be carried out.

In addition, in the example shown in FIG. 1, although only one pair of groups are connected in parallel so that the directions of the "pn" are reverse to a pair of electrode pads 4a and 4b, groups as many as a necessary number according to a desired brightness may be connected. In this case, a capacitor or a resistor may be connected in place of a part of one or more light emitting units 1, in order to adjust light to a desired brightness. A voltage applied between the pair of electrode pads is not limited to 100 V and an arrangement can be carried out in order to adjust to a desired voltage.

Figure 2:
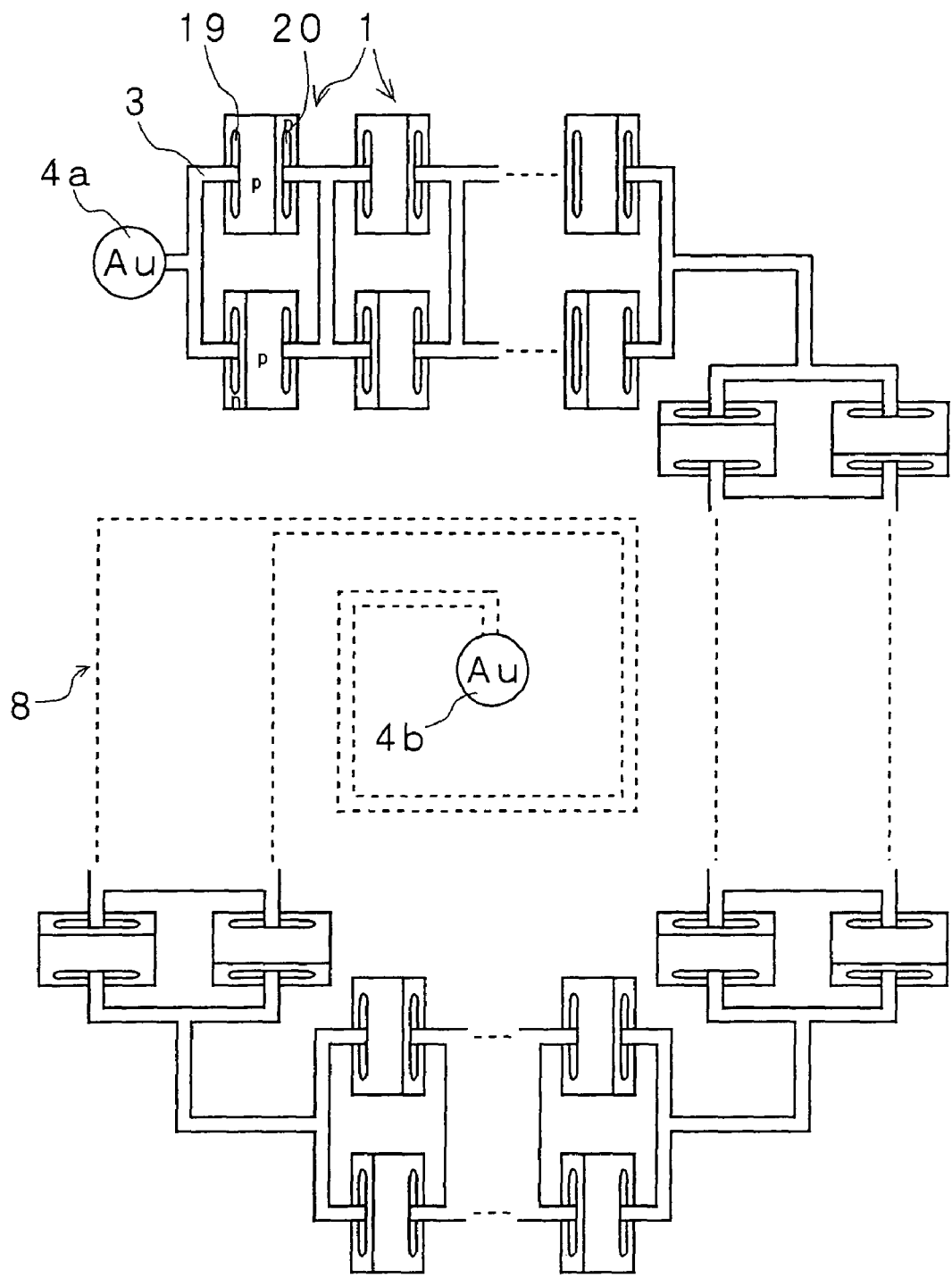
FIG. 2 is a similar view to FIG. 1 explaining a modified example of FIG. 1.

Further, in the example shown in FIG. 1, although a set of groups operated by an alternative current drive is formed by connecting groups formed by connecting the light emitting units 1 in series, in reverse parallel, the way of connecting each of the light emitting units is not limited to that of this case, and a plurality of sets, each of which is composed of two light emitting units connected in reverse (inverse) parallel as shown in FIG. 2, may be connected in series up to a number to make an operation voltage of approximately 100V. In such structure, an electric current begins to flow through light emitting units 1 of a forward direction according to a polarity of a surge, a magnetic field is generated by the electric current, and an inductance at the time prevents the surge from entering. Namely, in both structures shown in FIGS. 1 and 2, before the light emitting unit 1 is broken down by lots of electric current by a surge, the surge is prohibited from entering by a magnetic field generated by a little electric current. A connection shown in FIG. 2 is only different from that shown in FIG. 1 in a point that sets composed of 2 light emitting units 1 connected in reverse (inverse) parallel are connected in series, other structures are same and additionally a plurality of groups composed of the sets connected in series may be similarly connected in parallel. Same letters and numerals with FIG. 1 are attached to same parts in FIG. 2 and an explanation is omitted.

As shown, for example, in FIG. 3, the light emitting unit 1 shown in FIGS. 1 and 2 is formed as a light emitting device emitting white light, by forming light emitting units 1 (hereinafter, referred to as simply "LED", too) by laminating nitride semiconductor layers and by providing a light color conversion member, not shown in figures, made of, for example, a fluorescent material of YAG (Yttrium Aluminum Garnet), a fluorescent material of Sr—Zn—La or the like. Therefore, the semiconductor lamination portion 17 is formed by laminating nitride semiconductor layers. However, white light can be obtained by forming light emitting units of three primary colors, red, green and blue, too, and a light emitting portion emitted with a desired light color can be also formed, and white light is not always necessary. In addition, in the example shown in FIG. 3, in order to prevent problems of disconnection of the wiring film or increasing of resistance because of thin film caused by a level difference of the wiring film 3, a separation groove 17a separating each of the light emitting units 1 is formed so that surfaces of the semiconductor lamination portion in both sides of the separation groove 17a are in a substantially same plane. If the separation groove 17a is formed in a part of surfaces in the substantially same plane, the wiring film 3 can be formed without the level difference by forming the separation groove 17a as narrow as a width capable of an electrical insulation, even if recesses occur on the insulating film deposited therein.

Here, the substantially same plane does not mean a perfectly same plane, but means surfaces whose level difference is within a level of not raising a problem of a step-coverage caused by the level difference during forming the wiring film and means a level difference of both surfaces is approximately 0.3 μm or less in the concrete. Further, the nitride semiconductor means a compound of Ga of group III element and N of group V element or a compound (nitride) in which a part or all of Ga of group III element substituted by other element of group III element like Al, In or the like and/or a part of N of group V element substituted by other element of group V element like P, As or the like.

As a sapphire (single crystal $Al_2O_3$) or a SiC is generally used for the substrate 11 in case of laminating the nitride semiconductor, sapphire (single crystal $Al_2O_3$) is used in the example shown in FIG. 1. But a substrate is chosen from view point of a lattice constant or a thermal expansion coefficient depending upon semiconductor layers to be laminated on.

For example, the semiconductor lamination portion 17 laminated on the sapphire substrate 11 is formed by laminating following layers in order: a low temperature buffer layer 12 made of GaN and having a thickness of approximately 0.005 to 0.1 μm; a high temperature buffer layer 13 made of un-doped GaN and having a thickness of approximately 1 to 3 μm; an n-type layer 14 formed thereon, having a thickness of approximately 1 to 5 μm, composed of a contact layer made of an n-type GaN doped with Si and a barrier layer (a layer with a large band gap energy) made of an n-type AlGaN based compound semiconductor doped with Si, or the like; an active layer 15 which has a structure of a multiple quantum well (MQW) formed in a thickness of approximately 0.05 to 0.3 μm by laminating 3 to 8 pairs of well layers made of a material having a band gap energy lower than that of the barrier layer, for example $In_{0.13}Ga_{0.87}N$ and having a thickness of 1 to 3 nm, and barrier layers made of GaN and having a thickness of 10 to 20 nm; and a p-type layer 16 formed with a p-type barrier layer (a layer with a large band gap energy) made of a p-type AlGaN based compound semiconductor and the contact layer made of a p-type GaN, and having a thickness of approximately 0.2 to 1 μm in total.

In the example shown in FIG. 3, the high temperature buffer layer 13 is formed with GaN which is un-doped and semi-insulating. In case that the substrate is made of an insulating substrate like sapphire, it is not always necessary for the high temperature buffer layer to be semi-insulating because there is no problem if the separation groove is etched up to the substrate as described later, but the un-doped layer is preferable because a crystal structure of the semiconductor layer laminated on that is superior and further, by providing with semi-insulating semiconductor layers, the electrical separation can be obtained without etching up to the substrate surface when each of the light emitting units is separated. And in case that the substrate 11 is made of a semiconductor substrate like SiC, it is necessary to form the high temperature buffer layer 13 with un-doped and semi-insulating, for separating adjacent light emitting portions electrically and for making each of light emitting units independent.

The n-type layer 14 and the p-type layer 16 contain two kinds of the barrier layer and the contact layer in the above-described example, but only a GaN layer can be used sufficiently, although it is preferable with an aspect of carrier confinement effect to form a layer including Al at a side of the active layer 6. And, these can be formed with other nitride semiconductor layers or other semiconductor layers can be interposed. Although, in this example, a double hetero structure is shown in which the active layer 15 is sandwiched by the n-type layer 14 and the p-type layer 16, a structure of a p-n junction can be used in which the n-type layer and the p-type layer are directly joined. Further, although a p-type AlGaN based compound layer is formed directly on the active layer 15, an un-doped AlGaN based compound layer of approximately several nm thicknesses can be laminated on the active layer 15. Thereby, a leakage caused by a contact of the p-type layer and the n-type layer can be avoided while embedding pits created in the active layer 15 by forming a pit-creating layer under the active layer 15.

The light transmitting conductive layer 18 which is formed with, for example, ZnO or the like and makes an ohmic contact with the p-type semiconductor layer 16 is formed in a thickness of approximately 0.01 to 0.5 μm on the semiconductor lamination portion 17. A material of this light transmitting conductive layer 18 is not limited to ZnO, ITO (Indium Tin Oxide) or a thin alloy layer of Ni and Au having a thickness of approximately 2 to 100 nm can be used and diffuse current to whole part of a chip while transmitting light. A part of the semiconductor lamination portion 17 is etched so as to expose the n-type layer 14, and the separation groove 17a is formed by further etching the semiconductor lamination portion 17 in the vicinity of the exposed portion of the n-type layer 14 parting by an interval d. The reason why the separation groove 17a is formed at a position apart from the exposed portion of the n-type layer 14 with the distance d, not forming in the exposed portion of the n-type layer 14, is preventing a level difference of the wiring film 3 at a portion of the separation groove 17a from becoming large by being accompanied with increasing a width of the separation groove 17a and the exposed portion of the n-type layer 14. However, in the present invention, it is not indispensable to provide the distance d.

In case of providing the distance d, the spaced part of the distance is a dummy region 5 not contributing to light emitting region (portion of a length L1) and the interval d is set in a range of approximately 1 to 50 μm depending on a purpose because the region can be used as a space for making a heat dispersion portion or forming a wiring film as described later. The separation groove 17a is formed by a dry etching technique or the like, in a narrow width which electrical separation can be achieved, approximately 0.6 to 5 μm, for example approximately 1 μm (in a depth of approximately 5 μm).

Thereafter, a p-side electrode (upper electrode) 19 is formed on a part of a surface of the light transmitting conductive layer 18 with a lamination structure of Ti and Au, and an n-side electrode (lower electrode) 20 for a ohmic contact is formed on the n-type layer 14 exposed by removing a part of the semiconductor lamination portion 17 by etching with a Ti—Al alloy. In an example shown in FIG. 3, the lower electrode 20 is formed in a thickness of approximately 0.4 to 0.6 μm so as to be as almost same high as the upper electrode 19 is, in order to make the level difference of the wiring film 3 as small as possible. However, the lower electrode 20 is not necessary to be formed in the almost same height to the upper electrode 19, but may be in a usual height, since level difference is not formed so much because the wiring film 3 is deposited on the lower electrode 20 by evaporation or the like. On the other hand, as reliability of the wiring film is improved when the thickness of the lower electrode 20 is thicker than that of the upper electrode 19, the lower electrode 20 is preferably as almost same high as the upper electrode 19.

Then, an insulating film 21 made of $SiO_2$ or the like is provided on an exposed surface of the semiconductor lamination portion 17 and inside of the separation groove 17a so as to expose surfaces of the upper electrode 19 and the lower electrode 20. As a result, a plurality of the light emitting units 1 separated by the separation groove 17a are formed on the substrate 11. And when the exposed portion of the n-type layer 14 and the separation groove 17a are formed by patterning and the wiring films 3 are formed as shown in FIG. 1 or FIG. 2, a semiconductor light emitting device can be obtained, in which the light emitting units 1 are connected in series and/or parallel, and an inductor is built-in. A wiring film 3 is formed in a thickness of approximately 0.3 to 1 μm by depositing a metal film of Au, Al or the like by evaporation, sputtering or the like.

And next, an explanation on a method for manufacturing the semiconductor light emitting device with the structure shown in FIG. 3 will be given below. The semiconductor lamination portion is formed by a method of metal organic compound vapor deposition (MOCVD), supplying necessary gasses such as a reactant gas like trimethyl gallium (TMG), ammonia ($NH_3$), trimethyl aluminum (TMA), trimethyl indium (TMI) or the like, and a dopant gas like $SiH_4$ for making the n-type, or a dopant gas like biscyclopentadienyl magnesium ($Cp_2Mg$) for making the p-type.

At first, for example, the low temperature buffer layer 12 made of a GaN is deposited with a thickness of approximately 0.005 to 0.1 μm on the sapphire substrate 11, for example, at a temperature of approximately 400 to 600° C., thereafter, the high temperature buffer layer 13 of semi-insulating and made of an un-doped GaN with a thickness of approximately 1 to 3 μm and the n-type layer 14 formed of the GaN layer doped with Si and the AlGaN based compound semiconductor layer doped with Si with a thickness of approximately 1 to 5 μm are formed, at an elevated temperature of for example approximately 600 to 1200° C.

And at a lowered temperature of 400 to 600° C., the active layer 6 is formed which has a structure of a multiple quantum well (MQW) formed with a thickness of approximately 0.05 to 0.3 μm by laminating 3 to 8 pairs of well layers made of, for example, $In_{0.13}Ga_{0.87}N$ and having a thickness of 1 to 3 nm, and barrier layers made of GaN and having a thickness of 10 to 20 nm.

And, elevating a temperature in a growth furnace to approximately 600 to 1200° C., the p-type layer 16 including the p-type AlGaN based compound semiconductor layer and GaN layer are laminated 0.2 to 1 μm thick in total.

After forming a protective film made of $Si_3N_4$ or the like and annealing at a temperature of approximately 400 to 800° C. and for 10 to 60 minutes to activate the p-type dopant, a light transmitting conductive layer 18 is formed on a surface with, for example, a ZnO layer approximately 0.1 to 0.5 μm thick by a method of MBE, sputtering, evaporation, PLD, ion plating or the like. Successively, in order to form the n-type electrode 20, a part of the semiconductor lamination portion 17 is etched by a method of a reactive ion etching with chlorine gas so as to expose the n-type layer 14. Further subsequently, the semiconductor lamination portion 17 is etched with a width w of approximately 1 μm and reaching the high temperature buffer layer 13 of the semiconductor lamination portion 17, in the vicinity of the exposed portion of the n-type layer 14 and away from the exposed portion of the n-type layer 14, in order to separate each of the light emitting units 1 electrically by a dry etching technique similarly. The interval d between the exposed portion of the n-type layer 14 and the separation groove 17a is set, for example, approximately 1 μm. In addition, etching for exposing the n-type layer 14 and forming the separation groove 17a are carried out on a necessary region according to a pattern to be formed as shown in FIG. 1 or FIG. 2.

Subsequently, the n-side electrode 20 is formed on the exposed surface of the n-type layer 14 by depositing Ti and Al continuously with a thickness of approximately 0.1 and approximately 0.3 μm respectively by a method of sputtering or evaporating, and by RTA heating at approximately 600° C. for 5 minutes to make an alloy. Then, if the n-side electrode is formed by using a method of lift-off, the n-side electrode of a desired shape can be formed by removing a mask. Thereafter, the insulating film 21 made of $SiO_2$ or the like is formed on the entire surface and a part of the insulating film 21 is etched and removed so as to expose surfaces of the p-side electrode 19 and the n-side electrode 20. A chip of the semiconductor light emitting device shown in FIG. 1 or FIG. 2 can be obtained by steps of providing a photo resist film having openings only at connecting positions where the p-side electrode 19 and the n-side electrode 20 exposed are connected, depositing an Au film, Al film or the like by evaporating, forming the desired wiring film 3 by the method of lift-off removing the photo resist film, and dividing a wafer into chips, each of which has a group of light emitting units 1, composed of a plurality of light emitting units. In addition, at a time of forming the wiring films 3, the electrodes pads 4 (4a and 4b) for connecting to external power supply are formed of same material as that of the wiring films 3 simultaneously as shown in FIG. 1 or FIG. 2.

In the example shown in FIG. 3, since the exposed part of the n-type layer 14 for forming the n-side electrode 20 and the separation groove 17a for separating between the light emitting units 1 are formed at different positions even though they are near each other (a width of the dummy region 5 can be widened depending on a purpose), and since, moreover, as the n-side electrode 20 is formed high, it is not necessary that the wiring film 3 connecting the n-side electrode 20 and the p-side electrode 19 between adjacent light emitting units 1, makes connection through a large level difference, even though being formed through the separation groove 17a. In other words, a depth of the separation groove 17a is approximately 3 to 6 μm, but the width is very narrow such as approximately 0.6 to 5 μm, for example approximately 1 μm. Therefor, even if the separation groove 17a is not filled up with the insulating film 21 perfectly, a surface is almost closed and a large level difference does not occur in the wiring film 3, even some recess is formed. Thereby, problems of a step-coverage never occur and a semiconductor light emitting device provided with wiring films 3 having very high reliability can be obtained.

In the above-described example, surfaces of semiconductor layers in both sides of the separation groove 17a are formed in a substantially same plane by forming the exposed portion of the n-type layer 14 and the separation groove 17a at different places, however, even if the separation groove 17a is formed at an exposed portion continuously near the n-type layer 14 exposed, a problem of disconnection can be inhibited by providing a dummy region having an inclined surface (intermediate region). The example is explained by a similar cross-sectional view shown in FIG. 4.

Figure 4:
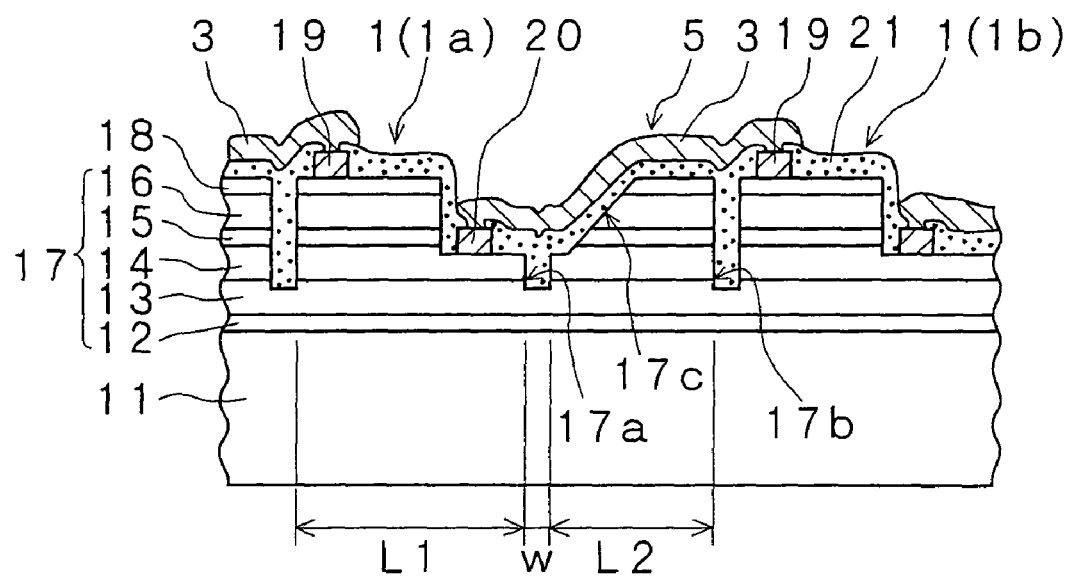
FIG. 4 is a cross-sectional view explaining another example of a light emitting unit of the light emitting device according to the present invention.

In FIG. 4, as the semiconductor lamination portion 17 is same as that in FIG. 3, same letters and numerals are attached and explanations are omitted. In this example, the separation groove 17a is formed not from the surface of the semiconductor lamination portion 17 but from the exposed surface of the n-type layer 14 so as to reach the high temperature buffer layer 13. But, an exposed portion of the n-type layer 14 is formed at an opposite place to a side of forming the n-type electrode 20 intervening the separation groove 17a, and it is characterized in that a dummy region 5 having an inclined surface 17c is formed, which extends from the exposed portion of the n-type layer 14 to a surface of the light transmitting conductive layer 18 on the semiconductor lamination portion 17.

The dummy region 5 is formed between one light emitting unit 1a and an adjacent light emitting unit 1b and in a width L2 of approximately 10 to 50 μm. Here, a width L1 of the light emitting unit 1 contributing to light emitting is approximately 60 μm. In addition, in the dummy region 5, the inclined surface 17c is formed from the exposed portion of the n-type layer 14 to the surface of the semiconductor lamination portion 17 as shown in FIG. 4. Although FIG. 4 is not accurate in dimensions but shows only schematic figure of the structure, the level difference between a surface of the light transmitting conductive layer 18 and the n-type layer 14 is approximately 0.5 to 1 μm as described above, and a distance from the exposed surface of the n-type layer 14 to a bottom of the separation groove 17a is approximately 3 to 6 μm. However, as the width w of the separation groove 17a is approximately 1 μm, at least a surface of the separation groove 17a is almost filled up with the insulating layer 21 even if some recess occurs. Then, if the wiring film 3 is formed through the exposed surface of the n-type layer 14 of the dummy region 5, problems of step-coverage can be almost solved, however the inclined surface 17c is formed on a surface of the dummy region 5 in the example shown in FIG. 4. By this, as the insulation film 21 and the wiring film 3 have a gentle slope, reliability of the wiring film 3 can be more improved.

In order to form such inclined surface 17c, masking with a photo resist film or the like except a portion where the inclined surface is formed, and etching with a method of dry etching while inclining the substrate 11 obliquely are carried out, and then the inclined surface 17c shown in FIG. 4 can be formed. After that, the semiconductor light emitting device of a structure shown in FIG. 4 can be formed, in a same manner shown in FIG. 3, by forming the p-side electrode 19 and the n-side electrode 20, forming the insulating film 21 so as to expose surfaces of the electrodes and forming the wiring films 3.

By forming this dummy region 5, besides that the inclined surface 17c described above can be formed, although the dummy region 5 itself does not contribute to emitting light, light emitted at an adjacent light emitting unit 1 and transmitted through semiconductor layers can be radiated from a surface or a side of the dummy region 5, and light emitting efficiency (output to input) can be improved compared to the case that the light emitting units 1 are continuously formed. When the light emitting units 1 are continuously formed, as dissipation of heat generated by energizing is hard, there exists probability of decreasing light emitting efficiency and deteriorating reliability, after all. However, it is preferable to form such dummy region 5 not emitting light from the view point of reliability, because the dummy region does not generate heat but dissipates heat easily. As shown in FIG. 2, in case of connecting two light emitting units 1 arranged in a lateral position with the wiring film 3, a space for forming the wiring film 3 is necessary. Here, the wiring film 3 can be formed on the dummy region 5, and the dummy region may be used as a space to form accessory parts such as an inductor, a capacitor, a resistor (which may be used as a series resistance for fitting to 100 V operation) or the like. In addition, as there exists a space for forming a wiring film freely, it becomes a merit to form a structure of the light emitting unit 1 itself in a desired shape easily such as a circular shape (shape of a top view) or the like instead of a quadrilateral shape, considering a structure for taking light out. Namely, not only inhibitions of disconnection of the wiring film, but also kinds of merits are accompanied. This way of utilizing the dummy region 5 may be used similarly in the example in FIG. 3.

In the example shown in FIG. 4, between the dummy region 5 and the light emitting unit 1 adjoining at a high side of the semiconductor lamination portion 17, a second separation groove 17b is formed from the surface of the semiconductor lamination portion and reaching to a high temperature buffer layer 13. The second separation groove 17b is also formed at a position where surfaces of the semiconductor lamination portion is in an almost same plane (substantially same plane), and formed in an interval as narrow as a width capable of an electrical insulation same as described above, namely approximately 1 μm. Then, if the wiring film 3 is formed on the second separation groove 17b through the insulating film 21, problem of disconnection or the like does not arise. Although the second separation groove 17b may not be formed, electrical separation between adjacent light emitting units 1 can be secured certainly, and reliability of separation is improved by forming the second separation groove 17b, even if the separation groove 17a does not reach the high temperature buffer layer 13 because of variance of etching.

Figure 5:
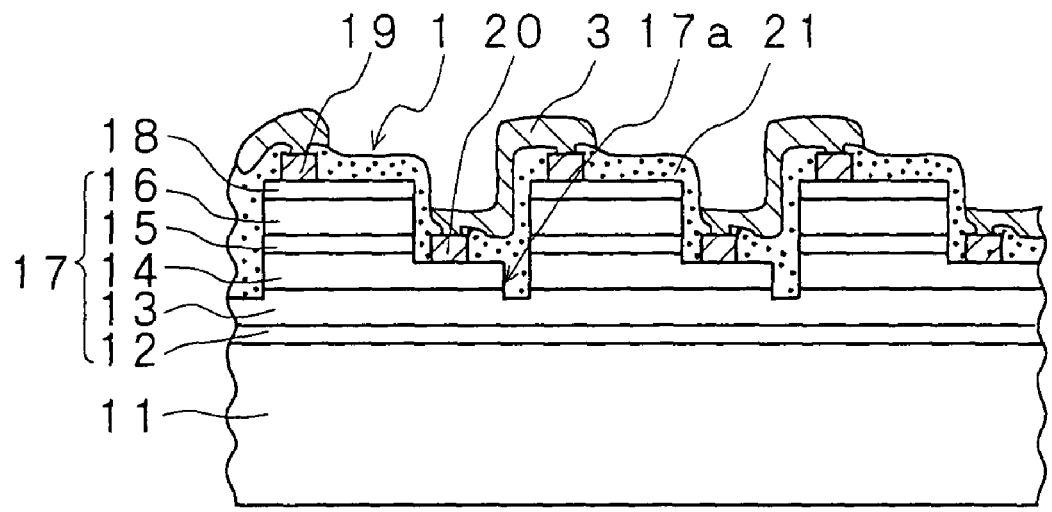
FIG. 5 is a cross-sectional view explaining still another example of a light emitting unit of the light emitting device according to the present invention.

FIG. 5 shows another example of a structure forming the wiring film 3. In this example, the separation groove 17a separating each of the light emitting units is not formed at a part of a surface of the semiconductor layer in the substantially same plane, but formed subsequently from the exposed surface of the n-type layer 14 at a part thereof. In this case, recesses such as separation grooves or the like are filled up by forming an insulating film which withstands to a high temperature of approximately 400° C., transparency and insulating property in the separation groove 17a, for example, by employing a product "spinfil 130" manufactured by Clariant Japan K.K. which is processed by spin coating and curing at 200° C. for 10 min and at 400° C. for 10 min, and the semiconductor light emitting device can be obtained because the level difference does not make problems so much even in forming the wiring film 3 directly from the exposed surface of the n-type layer to a layer of the upper electrode 19. In such manner, if the problems of the level difference caused by the separation groove 17a can be solved, the surfaces of the semiconductor layers in both sides intervening the separation groove 17a are not always indispensable to be in a substantially same plane. Here, as a structure of the semiconductor lamination portion 17 except a position of the separating groove 17a and a structure of the wiring films 3 are same as that of the examples shown in FIG. 3 or FIG. 4, the same letters and numerals are attached to the same parts and explanations are omitted.

Figure 6:
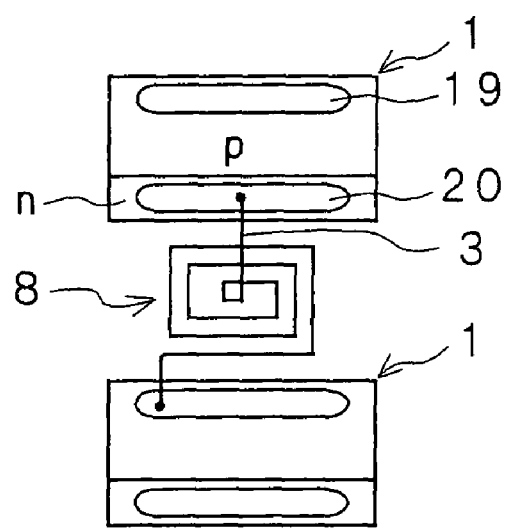
FIG. 6 is a figure showing another embodiment of the light emitting device according to the present invention.

FIG. 6 shows another embodiment of the semiconductor light emitting device according to the present invention. Namely, this is an example in which an inductor 8 is formed between adjacent light emitting units 1. In other words, it is an example of forming a whirl with the wiring film 3 utilizing a space of a surface of, for example, the above described dummy region shown in FIG. 4. An inductor having an inductance of approximately 1 to 10 nH can be formed by forming such whirl, and the inductor functions to decay the surge, even if the surge enters. The inductor 8 formed between light emitting units 1 is preferably formed near electrode pads, it is not necessary to form between all light emitting units because forming several inductors is sufficient to decay ordinary surges. Here, an end part of a center of the whirl is connected to a light emitting unit of one side with a wiring film provided through an insulating film not shown in the figure.

Figure 7:
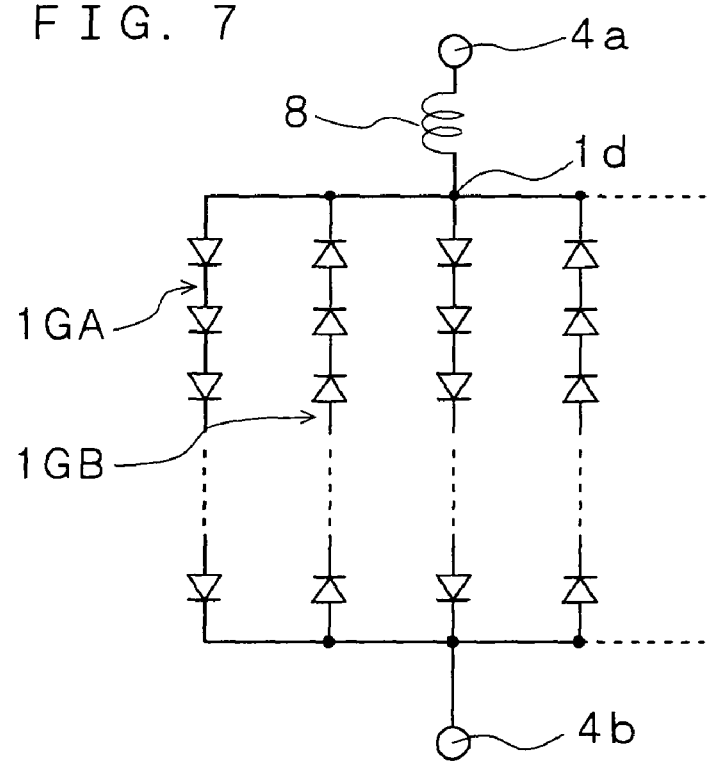
FIG. 7 is a figure showing still another embodiment of the light emitting device according to the present invention.
Figure 8:
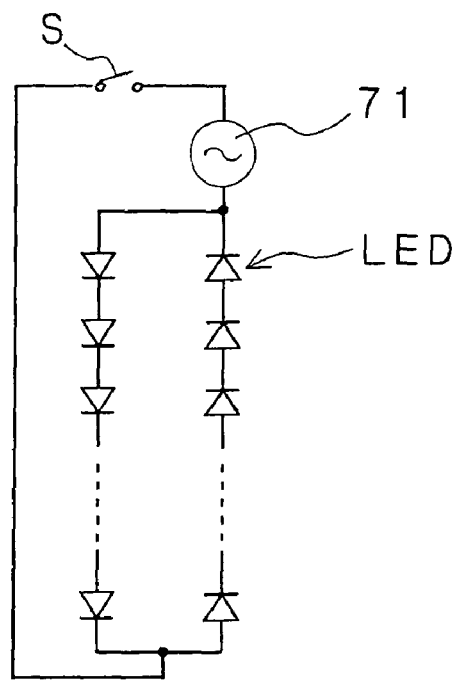
FIG. 8 is a figure showing an example of a conventional circuit for forming a lighting device using LEDs.

FIG. 7 shows still another example of the light emitting device according to the present invention. In case that at least two groups of light emitting units 1GA, 1GB and so on are connected in parallel between a pair of electrode pads 4a and 4b, and an inductor 8 is connected between a connecting portion Id connecting at least two groups 1GA and 1GB in parallel and one pad 4a of the pair of electrode pads. The inductor 8 may be formed in a space near the electrode pad 4a with a wiring film 3 (number of turns is larger than that of the example in FIG. 6) in the same manner as the example shown in FIG. 6. As a result, lots of light emitting units can be protected from surges by a small number of inductors. Although, the inductor 8 is connected only at a side of the electrode pad 4a in FIG. 7, it is preferable to be connected also at a side of another electrode pad 4b. In the reverse current surge, since a surge current flows from the side of the electrode pad 4b, the current can be decayed at a beginning stage of current flowing even in this case.

INDUSTRIAL APPLICABILITY

The light emitting device can be used for kinds of irradiation device such as ordinary irradiation device in place of fluorescent lamps by using commercial alternative current power sources and traffic signs or the like.

What is claimed is:

1. A semiconductor light emitting device comprising:
a substrate;
a semiconductor lamination portion formed on the substrate by laminating semiconductor layers so as to form a light emitting layer;
a plurality of light emitting units each formed in electrically separate portions of the semiconductor lamination portion, each of the plurality of light emitting units having a pair of electrodes which are each connected to a conductivity type layer of the semiconductor lamination portion, at least two of the plurality of light emitting units being connected in series between a pair of electrode pads, the electrode pads being connected to an external electric source;
wiring films which are each connected to at least one of the electrodes, wherein the wiring films connect each of the plurality of light emitting units in series and/or parallel;
an inductor shaped as a coil having plural loops, for absorbing surges, the inductor being connected between and in series with the at least two of the plurality of light emitting units;
an electrical separation to form the plurality of light emitting units is formed by a separation groove formed in the semiconductor lamination portion and an insulating film deposited in the separation groove; and
a dummy region which does not contribute to light emitting is formed between the separation groove and a light emitting unit of one side of the separation groove,
the inductor is formed within the dummy region,
the inductor has an inductance of approximately 1 to 10 nH, and
the inductor protects one or more of the plurality of light emitting units from an electrical surge that would otherwise damage the one or more light emitting units.

2. The semiconductor light emitting device according to claim 1, wherein a wiring film forming the inductor formed within the dummy region is made of Au or Al and in a thickness of 0.3 to 1 μm.

3. The semiconductor light emitting device according to claim 1,
wherein the semiconductor lamination portion is made of nitride semiconductor, and
wherein a light color conversion member converting a wavelength of light emitted in the light emitting layer to white light is provided at least at a light emitting surface side of the semiconductor lamination portion, thereby to emit white light.

4. The semiconductor light emitting device according to claim 1, wherein the external electric source is an alternative current source that drives the plurality of light emitting units.

* * * * *